US006121857A

United States Patent [19]

Huang

[11] Patent Number: 6,121,857

[45] Date of Patent: Sep. 19, 2000

[54] AC POWER PASSING RF CHOKE WITH A 15 GAUGE WIRE

[75] Inventor: Wei Huang, Campbell, Calif.

[73] Assignee: Harmonic, Inc, Sunnyvale, Calif.

[21] Appl. No.: 09/049,800

[22] Filed: Mar. 27, 1998

[51] Int. Cl.[7] .......... H03H 7/06

[52] U.S. Cl. .......... 333/172; 333/181; 333/185; 336/224

[58] Field of Search .......... 333/172, 181, 333/185; 336/224

[56] References Cited

U.S. PATENT DOCUMENTS

| | | | |
|---|---|---|---|
| 4,394,631 | 7/1983 | Pavlic | 333/132 |
| 5,032,808 | 7/1991 | Reddy | 333/181 |
| 5,179,334 | 1/1993 | Reddick | 323/355 |
| 5,483,208 | 1/1996 | Spriester | 333/131 |
| 5,805,042 | 9/1998 | Chastain et al. | 333/181 X |

OTHER PUBLICATIONS

"Modulation Distortion at Power frequencies—Hum", *Cable Television Roof of Performance—Chapter 10*, by Jeffery L. Thomas, Prentice Hall, 1995, pp. 211–228.

*Primary Examiner*—Justin P. Bettendorf
*Attorney, Agent, or Firm*—Skjerven, Morrill, et.; Norman R. Klivans; Gary J. Edwards

[57] ABSTRACT

An RF choke for separating or joining an RF signal and an AC power signal on e.g. a CATV transmission line has a large current carrying capacity. The RF choke uses 14 to 16 gauge magnetic wire in order to carry currents as high as 15 amps. In addition, the RF choke has excellent performance as measured by RF frequency response and hum modulation.

19 Claims, 4 Drawing Sheets

AC POWER PASSING RF CHOKE WITH A 15 GAUGE WIRE

BACKGROUND

1. Field of the Invention

This invention relates to a radio frequency choke and, more particularly, to a choke for separating or combining an AC power signal and an RF signal.

2. Prior Art

Commonly, cable television (CATV) distribution systems use broadband systems (5 to 1000 MHz) to carry various channel information to a subscriber and subscriber information back to the CATV provider. In hybrid fiber coax (HFC), a prevailing and commonly implemented architecture, the RF signal is transmitted from the CATV provider through optical fiber to an optical node/receiver. The RF signal is then transmitted through coaxial cable to the subscriber. The RF signal originating from the subscriber is transmitted through the coax plan (that section of the CATV system that transmits the RF signal over coaxial cable) to the optical node where it is transmitted through optical fiber to the CATV provider. Some CATV systems utilize coax plan only, without the use of any optical fiber in the system.

FIG. 1 shows a hybrid fiber coax (HFC) CATV system 100. The CATV provider, represented by head end 101, includes optical transmitters 102 for transmission of the RF signal through optical fiber 103 to optical node 104. Optical node 104 receives the RF signal from head end 101 and an AC power signal from AC power supply 105. Optical node 104 combines the RF signal and the AC power signal and transmits them onto coaxial cable 108. Various devices are attached to coaxial cable 108, including repeaters 106 and subscriber's receiver 107. The section of HFC system 100 that operates on coaxial cable, i.e. optical node 104, repeaters 106 and receiver 107, is collectively referred to as a coax plan 109.

The data for the various channels is typically transmitted at frequencies of between 50 and 1000 MHz while subscriber information sent to the CATV provider is typically transmitted at frequencies of between 5 and 40 MHz. In addition to the RF signals, a 60 Hz single phase power signal is sent from optical node 104 over the same coaxial cable in order to power various devices (e.g., RF amplifiers) that are attached to the coaxial cable at various points in the cable system. Typically, the 60 Hz AC power signal is at 60 volts and has a current magnitude of up to 15 A. In contrast, the broadband RF signal typically has a peak voltage of 0.3 V.

RF chokes are used in the various devices, such as repeaters 106, attached to coaxial cables line 108 and at the subscriber's receiving station 10)7. The RF choke separates the RF signal from the single-phase AC power signal by presenting a low impedance to the 60 Hz AC power signal while presenting a high impedance to the 5–1000 MHz RF signal, thereby shunting the AC power signal through the RF choke while blocking passage of the RF signal. Additionally, an RF choke can be used to combine an RF signal with an AC power signal, as is required in optical node 104 and in repeaters 106. The ideal RF choke would pass all of the AC power signal through the choke while blocking all of the broadband RF signal.

A typical device present on coaxial plan 109 is repeater 106. Repeaters 106 are inserted at various locations along coaxial cable line 108 and perform the function of insuring that the RF signal that arrives at the subscriber station is sufficiently intense to provide good television reception. At repeater 106, an RF choke is used to separate the RF signal from the AC power signal. The AC power signal is used to power an amplifier that amplifies the RF signal. The amplified RF signal and the AC power signal are then recombined, again using an RF choke, for transmission to the next device on coaxial cable 108. It is important, especially in coax plans 109 having multiple devices at various locations along coaxial cable 108, that each device have a relatively flat frequency response to minimize distortion in the RF signal. In separating the AC power signal from the RF signal, therefore, the RF choke should not leak a significant amount of the RF signal into the AC power signal, thereby causing significant frequency dependent loss of RF signal.

Typically, an RF choke comprises a number of turns of magnetic wire around a magnetic core to form coils. A resistor may also be inserted across a portion of the magnetic wire coils. There are essentially four, often conflicting, considerations concerning an RF choke. One such consideration is the frequency response of the RF choke. The self-capacitance between the turns of wire in the choke, combined with the inductance of the choke, produces various LC resonances that often fall within the broadband RF signal frequencies. The result of these resonances is a loss of RF signal power through the RF choke at those resonances. The cumulative effects of all of the various RF signal power losses in the transmission can attenuate the RF signal at that resonant frequency, especially where the same or similar components having similar frequency responses are used in various devices throughout the cable. A shunt resistor may mitigate this effect by destroying the quality factor Q of the LC resonance. However, the presence of the shunt resistor also reduces the RF signal impedance to ground, thereby increasing RF signal loss. Additionally, epoxies used to hold the turns of wiring on the magnetic core also operate to increase the self-capacitance between wires by increasing the dielectric constant between wires, thereby worsening the frequency response.

A second consideration concerns the frequency response and return loss at low frequencies. If the RF choke has too much inductance, resonances are created at high RF frequencies because of the Inherent self-capacitance. However, too little inductance results in excessive insertion loss and return loss at low RF frequencies.

Another consideration is "hum" modulation. Hum modulation refers to the distortion of the RF signal that results from saturation of the RF choke because of the high current of the AC power signal. With high currents, core materials are likely to approach magnetic saturation, thereby presenting the RF signal with an impedance that varies with the frequency of changes in the AC power signal.

In addition, the RF choke must be able to carry up to 15 A of current associated with the AC power signal. Typically, chokes of this type use 18 to 20 gauge wiring, which is not rated sufficiently high to carry 15 A currents. For example, 18 gauge wire is sufficient to carry about 10 A of current. In addition, the RF choke must be able to efficiently dissipate heat.

Therefore, there is a need for an RF choke with a flat frequency response in the 5–1000 MHz range, good return loss, good hum modulation characteristics, and high current carrying capacity.

SUMMARY

According to this invention, an RF choke is formed using large diameter (15 gauge) polyurethane insulated magnetic wire around a small diameter (about 0.3 inch) ferrite rod.

The wire is wound around the ferrite rod to form two inductors, a first inductor having one 4 turn tight winding and a second inductor having three groups of 5 turn tight windings. A shun resister, which dampens the self-resonance effect, is placed across the first inductor.

An RF choke according to this invention has improved performance in current carrying ability and in hum modulation from that of previously known RF chokes.

In the figures, the same or similar components are identically labeled throughout.

DETAILED DESCRIPTION

Figure 1:
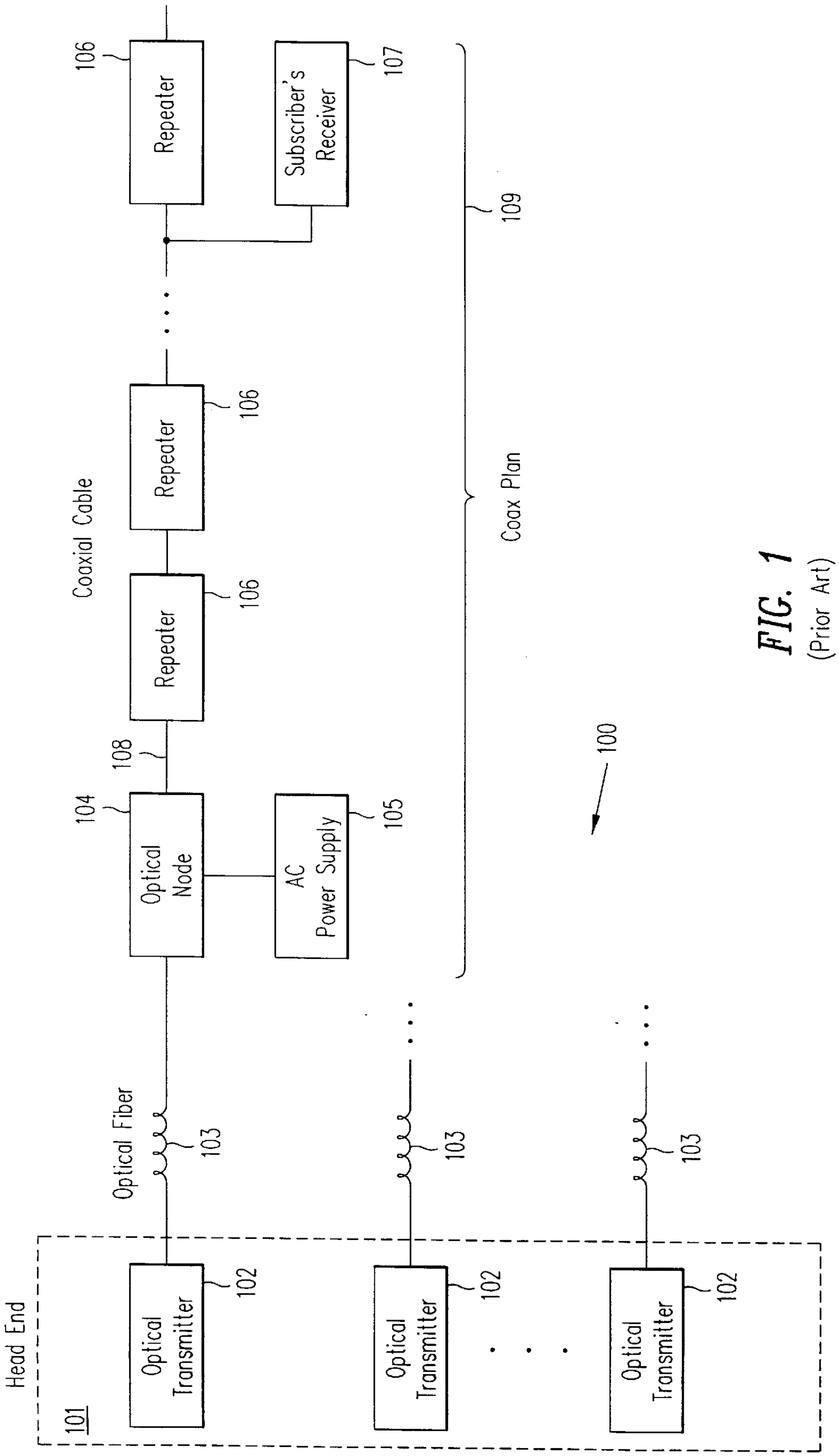
FIG. 1 (Prior Art)
FIG. 1 shows a hybrid fiber coax cable system.
Figure 2:
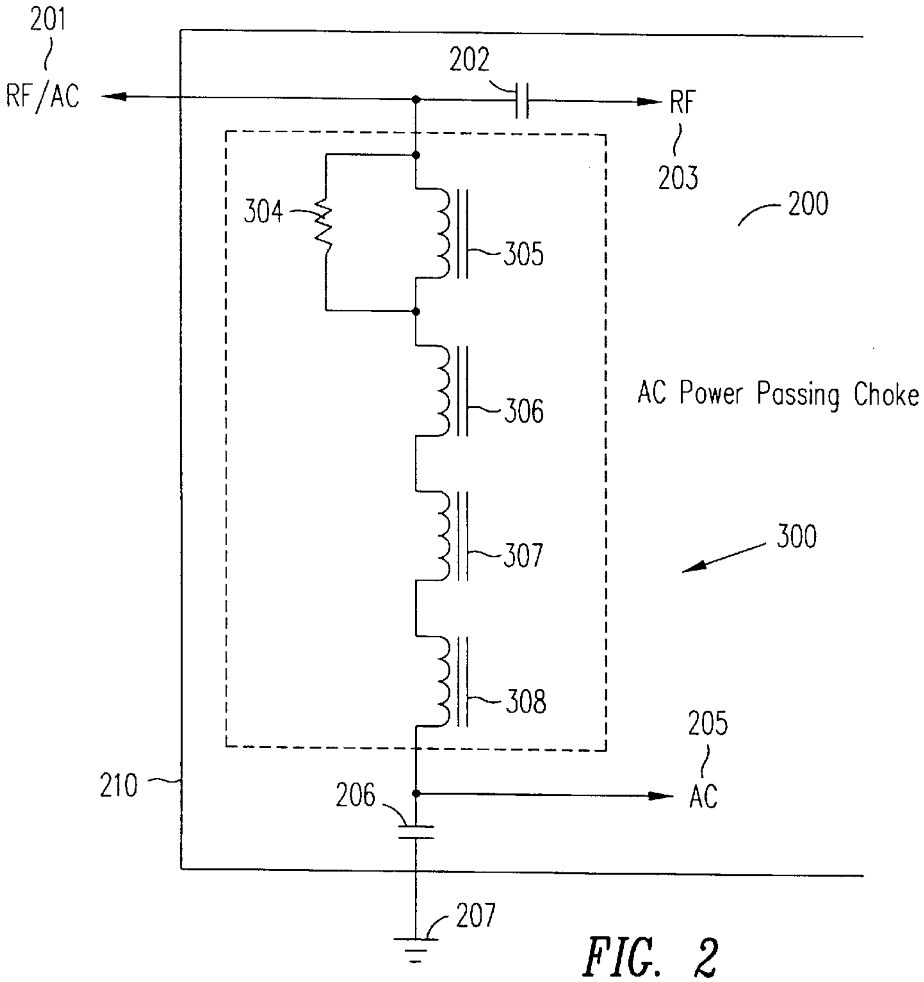
FIG. 2 shows an RF choke according to this invention used in a circuit for separating an AC power signal from an RF signal.

FIG. 2 shows a circuit 200 where an RF choke 300 separates the AC power signal from the RF signal. A similar circuit would be used for combining an RF signal with an AC power signal. In FIG. 2, circuit 200 is shown as a part of device 210, which is one of the devices that can be attached to a coax plan such as coax plan 109 (i.e., receiver, repeater, optical node etc.). In FIG. 2, line 201 carries both the AC power signal and the RF signal. The RF signal is in the range of 5 to 1000 MHz and has a peak-to-peak voltage of about 0.3 V. Often, the RF signal includes a data signal from a CATV provider with frequency range of 50 to 1000 MHz and subscriber information to the CATV provider in the frequency range from 5 to 40 MHz. The AC power signal is a 60 Hz, 60 V signal having a current of up to 15 amps.

RF choke 300 presents a low impedance to the 60 Hz signal while presenting a high impedance to the RF signal. A capacitor 202 couples the RF signal to RF line 202. Another capacitor 206 provides an effective path to ground 207 for an RF signal while presenting an open circuit to the AC power signal. The AC power signal is presented on power line 205. In a device inserted between the CATV provider and a subscriber, power line 205 is used to power the device which typically amplifies the RF signal on RF line 203. The RF signal and the AC power signal are then reunited for transmission to the next device on the line or to the subscriber's receiver. If circuit 200 is used in the subscriber's receiver, the RF signal on RF line 203 is received and interpreted. Circuit 200 may also function to combine an RF signal presented to RF line 202 and an AC power signal presented on power line 205 for transmission on line 201.

Figure 3:
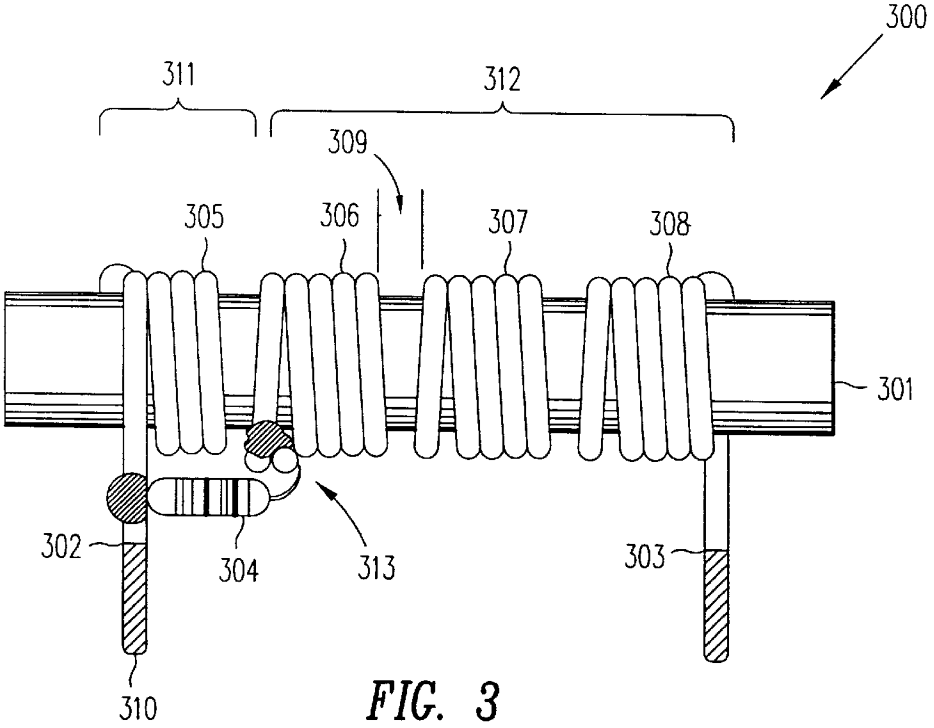
FIG. 3 shows an RF choke according to this invention.

FIG. 3 shows an RF choke according to the present invention. RF choke 300 includes magnetic wire 310 that, because of the high current, is a 14 to 16 gauge wire. The choice of 14 to 16 gauge wire for use as magnetic wire 310 allows 15 A of current to pass safely. Typically, RF chokes utilize only 20 or 18 gauge wire, although some have disclosed wire gauges in differently structured coils of up to 16, that are not rated for higher currents. An 18 gauge wire, for example, can reliably and safely handle currents up to about 10 A. The larger wire size allows safer operation and, because of the lower internal resistance of the wire, reduces the heat generated by the wire. In addition, the larger wire size increases heat dissipation because of the larger surface area of the wire.

However, increased wire size aggravates two existing problems, which is why it is disfavored in the prior art. One is that the larger wire size increases the capacitive coupling between the turns of magnetic wire 310 and consequently lowers self-resonance frequencies. Lowering the self-resonance frequencies results in reducing the desired high frequency response of RF choke 300. The other problem is that increased wire size, where all remaining parameters stay the same, reduces the inductance of RF choke 300, causing lower shunt impedance for low frequencies (i.e., around 5 MHz). The lowered shunt impedance causes excessive insertion loss and undesirable return Loss.

These problems are mitigated in accordance with this invention by the use of a smaller diameter but longer magnetic rod core 301 compared to that of the prior art. The use of a smaller diameter magnetic rod core 301 results in an increase in the number of turns required to produce a predetermined inductance value. If smaller diameter wire windings were used there would be less overlapping area between each turn and the overall coupling capacitance between leads is reduced. The result is that the self resonance frequency becomes much higher and may exceed the frequency band of interest, resulting in a clean frequency response at the high end of the frequency band.

However, with the larger diameter wiring, use of combinations of groups of turns and spacing reduces the overall capacitive coupling in order to watch the situation where the smaller diameter wiring is used. It can be shown that, once the inductance and core material is fixed, the required overall length of wire is fixed for any diameter of core material.

In FIG. 3, a long and thin magnetic core rod 301 has two series inductors 311 and 312 wound around the rod 301. Magnetic core rod 301, although preferably formed from ferrite, can also be formed from powdered iron or the like that exhibits a permeability adaptable for transmission of 5–1000 MHz RF signals. In FIG. 3, magnetic core rod 301 is made from ferrite and is approximately 2 inches long and 0.3 inches in diameter. Magnetic core rod 301 is long enough to accommodate both inductors 311 and 312 and therefore the length can range from 2 inches to 2.5 inches. The diameter of magnetic core rod 201 can be varied between about 0.25 inches and 0.35 inches without substantial loss of performance. Use of a material other than ferrite for the magnetic core rod may require a core rod having differing dimensions in order to produce an RF choke having similar characteristics.

Both inductors 311 and 312 are wound with a length of wire 310. Although wire 310 may be a single length of magnetic wire, it often is separated into two or more segments for ease of construction. Wire 310 is preferable a 15 gauge polyurethane insulated magnetic wire 310 having an overall length of approximately 24 inches. Additionally, 14 to 16 gauge wire can be used for magnetic wire 310 without substantial loss of performance or current carrying capacity. Inductor 311 is formed from winding 305, which is a tight winding having 4 turns. One end of wire 310 forms terminal 311 and wire 310 is tightly wound around magnetic core rod 301 4 times to form winding 305. Terminal 311 is connected to line 201 in FIG. 2 and carries both the RF signal and the AC power signal.

Wire 310 continues to be wound around magnetic core rod 301 to form a second inductor 312 having 3 windings 306, 307 and 308. Windings 306, 307 and 308 each are tight windings having 5 turns. The end of wire 310 opposite terminal 311 forms AC terminal 303. In FIG. 2, AC terminal 303 is connected to AC line 205. A gap of approximately 0.1 inches, between 0.08 inches and 0.12 inches, exists between adjacent windings 305, 306, 307 and 308. If a material other than ferrite is used as the magnetic core rod, other combination of turns and spacings may be required in order to meet the same performance characteristics. Magnetic wire 310, after being wound around magnetic core rod 301 to form inductors 311 and 312, is epoxied in place with one of several well known epoxies, preferably UV532.

Resistor 304 is connected across inductor 311. In FIG. 3, wire 310 has two segments separated at a node 313 between first inductor 311 and second inductor 312. Resistor 304 is connected between terminal 311 and node 313. At node 313, first inductor 311, second inductor 312 and resistor 304 are electrically connected. Resistor 304 is preferable a 560 Ohm, 0.25 Watt, resistor of a common type but any resistance in the range from e.g. 470 Ohms to 680 Ohms will perform satisfactorily. Resistor 304 is used to damp the small self-resonance effects due to the self-capacitance. The effect of the resistor is to destroy the quality factor Q of the LC resonant circuit formed as a result of the self-capacitance so that resonances within the 5–1000 MHz band are broader and shallower, thereby reducing the effect of the resonance on the RF signal.

Figure 4:
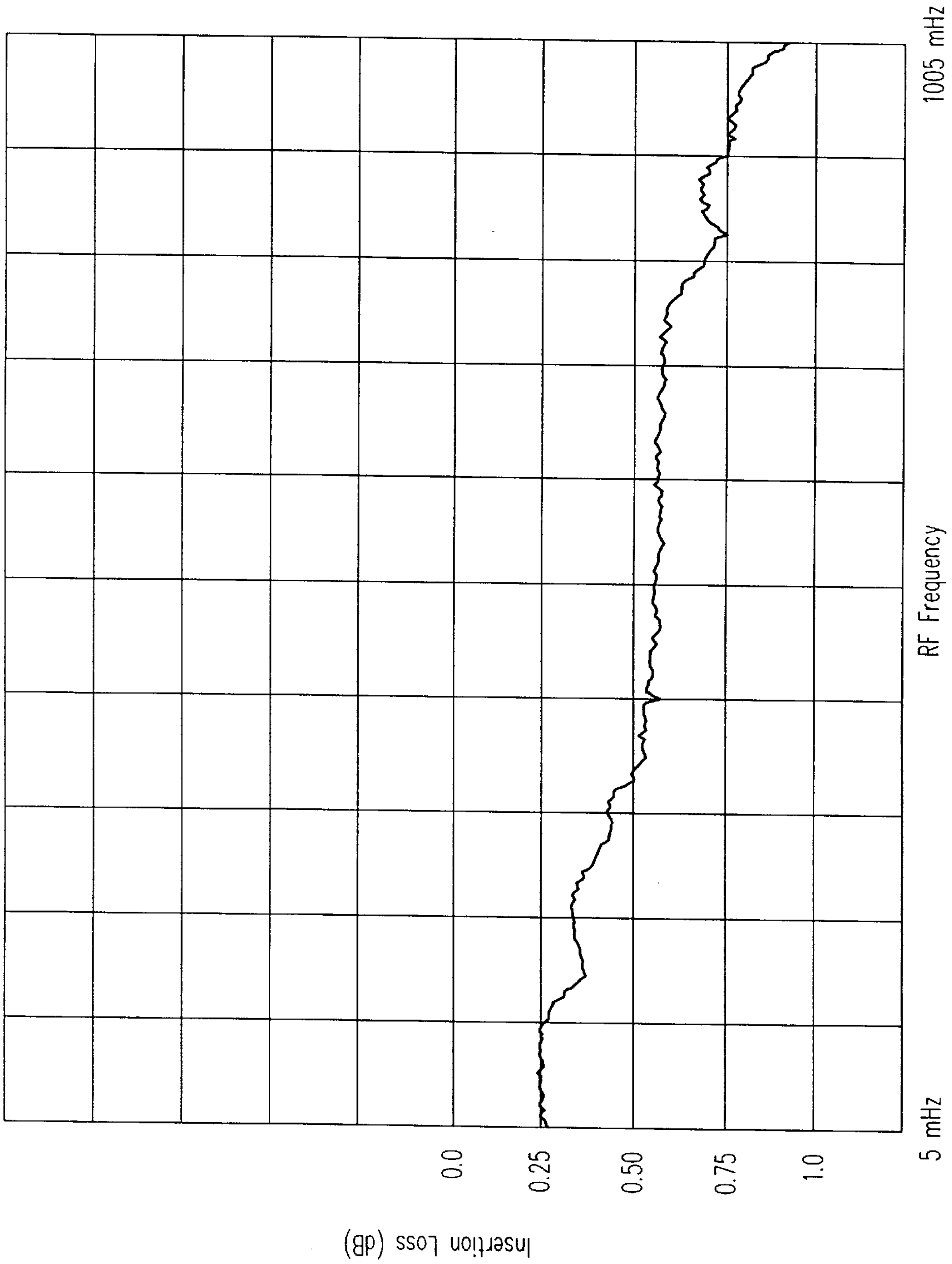
FIG. 4 shows a graph of the insertion loss versus frequency for an RF choke according to this invention.

FIG. 4 shows the frequency response (insertion loss) of the RF choke 300. The graph in FIG. 3 displays the insertion loss (in dB) versus RF frequency (in MHz). On such a graph, a large swing in decibels indicates a large effect on the RF signal. RF choke 300 shows excellent over-all frequency response across the entire range of 5–1005 MHz, ranging smoothly from about 0.25 dB at 5 MHz to 0.9 dB at 1005 MHz. As can be seen from FIG. 4, there are no significant resonances in the RF choke in the range from 5 to 1000 MHz.

RF choke 300 has another advantage in improved hum modulation characteristics. Hum modulation is known to be worse when the RF choke is placed within a metal enclosure, which has an effective RF ground plane. In general applications, RF choke 300 is mounted on a printed circuit board within a metal enclosure such as an optical node amplifier housing or CATV distribution amplifier. A typical enclosure will have much larger dimension in the horizontal direction where the printed circuit board sits than in the vertical direction. Therefore, for a fixed metal enclosure, the larger the diameter of the choke, the closer it is to the RF ground or more coupling area and the worse the hum modulation.

Figure 5:
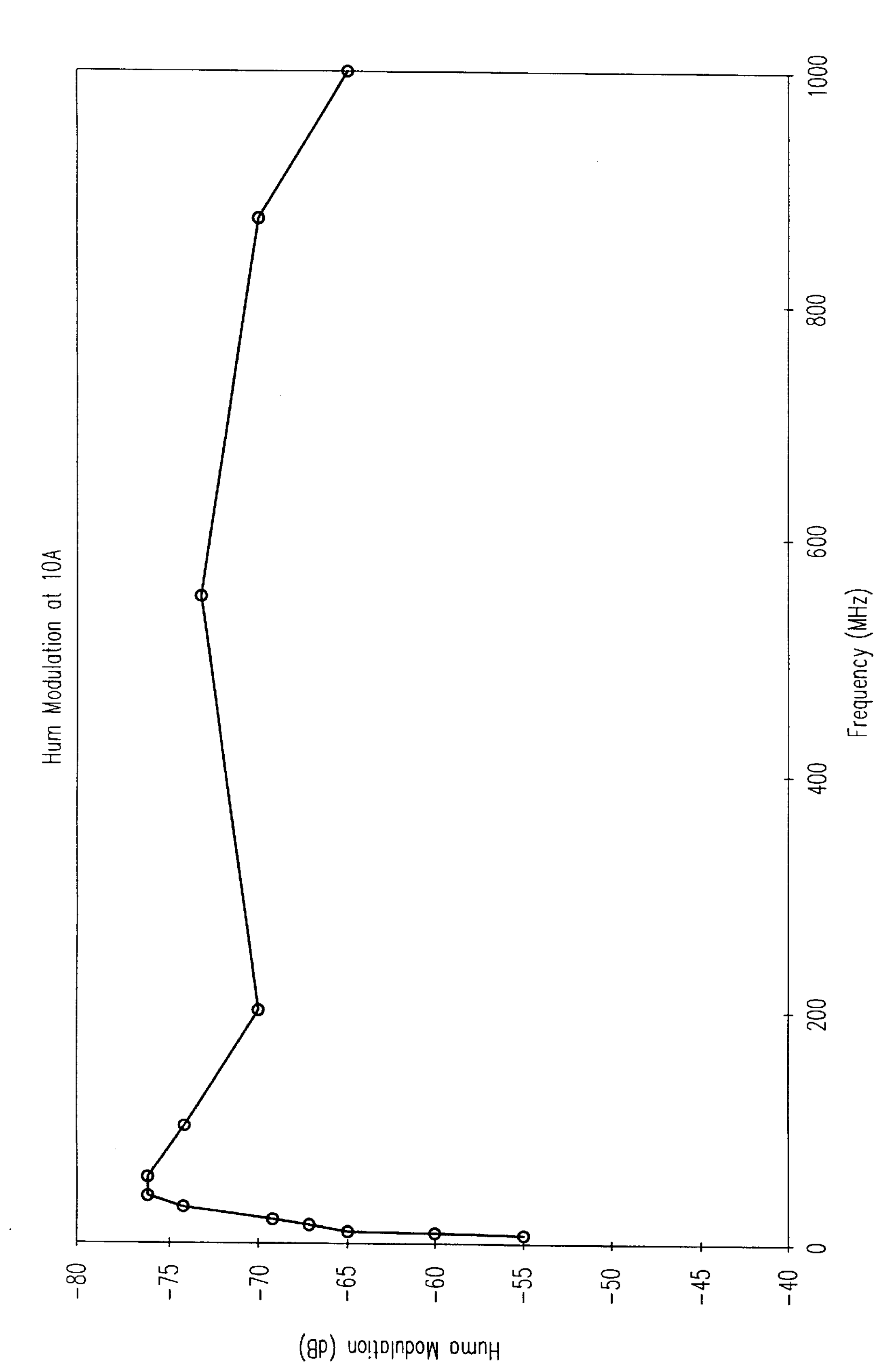
FIG. 5 shows a graph of hum modulation versus frequency for an RF choke according to this invention.

FIG. 5 shows a graph of hum modulation versus frequency for RF choke 300. Hum modulation refers to distortion of the RF signal that results from saturation of the RF choke because of high currents in the AC power signal saturating the magnetic materials in RF choke 300. In FIG. 5, RF choke 300 is saturated with a 60 Hz, 60 V, AC signal at a current of 10 amps. The attenuation in an RF signal is then measured. RF choke 300, with a 10 A current, performs as well or better than many comparable chokes. (See, e.g. U.S. Pat. No. 5,483,208, FIG. 5).

The examples shown above are demonstrative only. Variations that are obvious to one skilled in the art are included in the scope of this invention. As such, the invention is limited only by the following claims.

I claim:

1. An RF choke, comprising:

a core;

a conductor wound around the core to form a first inductor and a second inductor, the first inductor having a first winding, the second inductor having at least one second inductor winding, the conductor having a wire diameter at least that of 15 AWG gauge wire; and a resistor connected across the first inductor.

2. The RF choke of claim 1, wherein:

the first winding of the first inductor comprises a four turn tight winding; and the second inductor comprises a second winding, a third winding, and a fourth winding, each of the second winding, the third winding, and the fourth winding comprising a five turn tight winding.

3. The RF choke of claim 2, wherein the first winding, the second winding, the third winding, and the fourth winding are equally spaced apart along the core.

4. The RF choke of claim 3, wherein the core is a ferrite core.

5. The RF choke of claim 3, wherein the core is formed from powdered iron.

6. The RF choke of claim 4, wherein the core is about 2 inches long and has a diameter of between 0.25 and 0.35 inches.

7. The RF choke of claim 6, wherein the conductor is 14 to 15 gauge wire.

8. The RF choke of claim 7, wherein the spacing between the first winding, the second winding, the third winding and the fourth winding is between 0.08 inches and 0.12 inches.

9. The RF choke of claim 8, wherein the resistor has a resistance between 470 Ohms and 680 Ohms.

10. The RF choke of claim 6, wherein the core has a diameter of 0.3 inches.

11. The RF choke of claim 10, wherein the conductor is 15 gauge wire.

12. The RF choke of claim 11, wherein the spacing between the first winding, the second winding, the third winding and the fourth winding is 0.1 inches.

13. The RF choke of claim 12, wherein the resistance is 560 Ohms.

14. A device for attachment to a transmnission line, comprising:

an input terminal connectable to a cable carrying both RF signals and an AC power signal; an RF choke comprising a core, a conductor wound around the core to form a first inductor and a second inductor, the first inductor having a first winding, the second inductor having at least one second inductor winding, the conductor having a diameter of 15 AWG wire; and a resistor connected across the first inductor; and wherein the first terminal is connected to the input terminal.

15. The device of claim 14, wherein:

the first inductor comprises a first winding, the first winding being a four turn tight winding; and the second inductor comprises a second winding, a third winding, and a fourth winding, each of the second winding, the third winding and the fourth winding being a five turn tight winding.

16. The device of claim 15, wherein the core is a ferrite rod approximately 2 inches long and between 0.25 inches and 0.35 inches in diameter.

17. The device of claim 16, wherein the conductor is a 14 to 15 gauge wire.

18. The device of claim 17, wherein the first winding, the second winding, the third winding and the fourth winding are evenly spaced along the core with a spacing of between 0.08 inches and 0.12 inches.

19. The device of claim 18, wherein the resistor has a resistance of between 470 Ohms and 680 Ohms.

* * * * *